United States Patent [19]
Nakatani

[11] Patent Number: 5,225,703
[45] Date of Patent: Jul. 6, 1993

[54] DUAL FIELD EFFECT TRANSISTOR STRUCTURE EMPLOYING A SINGLE SOURCE REGION

[75] Inventor: Mitsunori Nakatani, Itami, Japan

[73] Assignee: Mitsubishi Denki Kabushiki Kaisha, Tokyo, Japan

[21] Appl. No.: 707,752

[22] Filed: May 30, 1991

[30] Foreign Application Priority Data

Jun. 11, 1990 [JP] Japan .................................. 2-153395

[51] Int. Cl.⁵ ..................... H01L 29/80; H01L 29/10; H01L 29/161
[52] U.S. Cl. .................................. 257/401; 257/900; 257/192; 257/27; 257/11
[58] Field of Search ................. 357/22 A, 42, 16, 23.3, 357/22 MD; 257/192, 900, 27, 11, 401

[56] References Cited

U.S. PATENT DOCUMENTS

| | | | |
|---|---|---|---|
| 5,001,536 | 3/1991 | Fukuzaw et al. | 357/22 A |
| 5,021,857 | 6/1991 | Suehiro | 357/42 |
| 5,041,393 | 8/1991 | Ahrens et al. | 357/16 |

FOREIGN PATENT DOCUMENTS 1303762 12/1989 Japan .

OTHER PUBLICATIONS

Matsunaga et al., "Half-Micron Gate GaAs ... Fabrication", IEEE GaAs IC Symposium, 1989, pp. 147-150.
Imamura et al., "A WSi/TiN/Au ... Using MOCVD", Japanese Journal of Applied Physics, vol. 23, No. 5, 1984, pp. L342-L345.

Primary Examiner—William Mintel
Assistant Examiner—Wael Fahmy
Attorney, Agent, or Firm—Leydig, Voit & Mayer

[57] ABSTRACT

A field effect transistor comprises a semi-insulating first compound semiconductor substrate having a surface, a first compound semiconductor active layer disposed at the surface of the substrate and having a first dopant concentration, a gate electrode disposed on the active layer, an epitaxial first compound semiconductor source region disposed on part of the active layer spaced from the gate electrode wherein the source region has a second dopant concentration higher than the first dopant concentration, a source electrode disposed on the source region, an electrically insulating layer disposed on the active layer between the contacting the source region and the gate electrode, a drain region disposed in the substrate adjacent to and in contact with the active layer on an opposite side of the gate electrode from the source region having a dopant concentration intermediate the dopant concentrations of the source region and the active layer, and a drain electrode disposed on the drain region.

12 Claims, 14 Drawing Sheets

FIG.6(c)
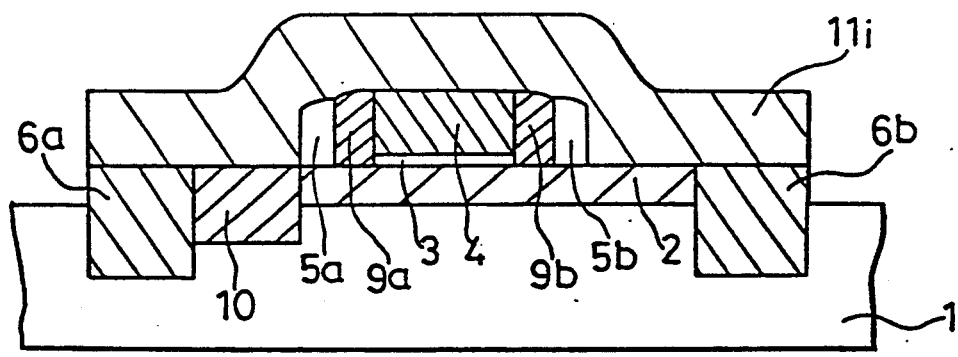
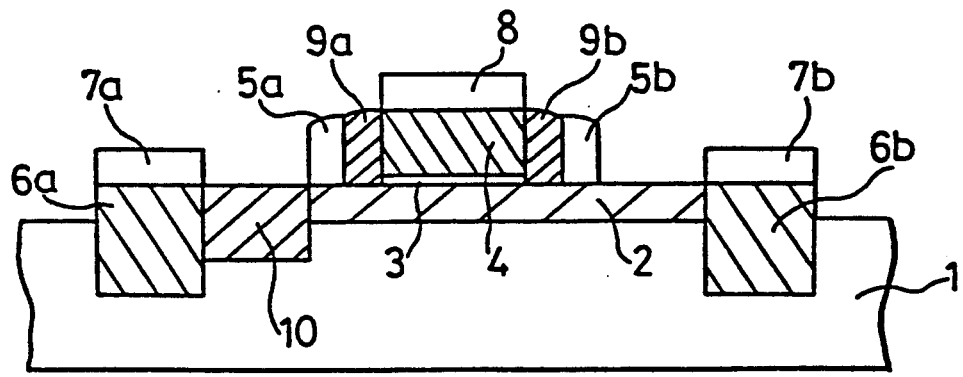
FIG. 6(d)

(PRIOR ART)

DUAL FIELD EFFECT TRANSISTOR STRUCTURE EMPLOYING A SINGLE SOURCE REGION

FIELD OF THE INVENTION

The present invention relates to a semiconductor device and a method for manufacturing the semiconductor device. The invention particularly relates to a field effect transistor (FET) having an epitaxially grown source region disposed on an epitaxially grown active layer and a drain region disposed in a substrate adjacent to and in contact with the active layer and a method for manufacturing the FET structure.

BACKGROUND OF THE INVENTION

FIG. 8 is a cross-sectional view schematically illustrating a conventional field effect transistor. The FET includes a semi-insulating compound semiconductor substrate 1, such as gallium, arsenide (GaAs), having a surface and a active layer 2 disposed in the substrate 1 adjacent the surface. The active layer 2 is usually formed by ion implantation and has a relatively low dopant concentration compared to the dopant concentrations of a source region 4a and a drain region 4b formed in the substrate 1 at opposite ends of the active layer 2. The source region 4a and the drain region 4b are generally formed simultaneously by ion implantation and usually have the same dopant concentrations. A gate electrode 5 is disposed on the surface of the substrate 1 on the active layer 2 and forms a Schottky barrier with the active layer. Ohmic contacts to the drain region 4b and the source region 4a are made by electrodes 7 and 8, respectively.

For high quality performance, the dopant concentration in the source and drain regions 4a and 4b is made as high as possible. However, when those regions are formed by ion implantation in GaAs, the dopant concentration cannot exceed about $2 \times 10^{18}$ cm$^{-3}$, thereby limiting the desired reduction in the source resistance. In addition, when there are crystalline defects within the substrate 1 that occur naturally or in the ion implantation process, a leakage current that is not influenced by the signal applied to the gate electrode can flow between regions 4a and 4b. As the FET becomes smaller, the leakage current becomes more significant and causes increasing problems.

A field effect transistor having a structure intended to reduce the resistance of the source and to reduce leakage current is shown in a schematic cross-sectional view in FIG. 9 and was described in *GaAs IC Symposium Technical Digest*, pages 147-150, 1989. In FIG. 9 and all other figures of this application, the same elements are given the same reference numbers. In the structure of FIG. 9, the source and drain regions 4a and 4b are disposed on the active layer 2 on the surface of, and not within, the semi-insulating GaAs substrate 1. The gate electrode 5 is disposed between the source and drain regions on the surface of the substrate and separated from those regions by electrically insulating side wall films 9b and 9a, respectively.

FIGS. 10(a)-10(d) illustrate in cross-sectional views a process for manufacturing the FET of FIG. 9. As shown in FIG. 10(a), after the formation of the active layer 2 by ion implantation and the formation of the gate electrode 5, which may be a refractory metal silicide such as tungsten silicide (WSi$_x$), by vapor deposition and photolithographic processing, an electrically insulating film 9', such as silicon dioxide (SiO$_2$), is deposited on the surface of the substrate and the gate electrode 5. The electrically insulating film 9' is etched by reactive ion etching (RIE) so that the film is removed from the substrate except for the residual side wall films 9a and 9b that remain at the opposed side walls of the gate electrode 5.

Thereafter, as illustrated in FIG. 10(c), the source and drain regions 4a and 4b are epitaxially grown, for example, by metal organic chemical vapor deposition (MOCVD). MOCVD is a selective process and the relatively highly doped semiconductor film that forms regions 4a and 4b does not grow on the gate electrode or on the side wall films 9a and 9b. Because the maximum dopant concentration can be higher in an epitaxially grown film than in an ion implanted region, the source resistance of the FET of FIG. 9 can be lower than the source resistance of the FET of FIG. 8. The FET of FIG. 9 is completed by forming the metal electrodes 7 and 8, as shown in FIG. 10(d).

A number of problems are created by the process of FIGS. 10(a)-10(d). For example, in the RIE removal of electrically insulating film 9', the surface of the substrate 1 is subjected to a plasma that may cause contamination and roughness of the surface. That surface roughness adversely affects the crystallinity of the source and drain regions 4a and 4b that are subsequently epitaxially grown. The poor crystallinity increases the resistance of those regions and the rough surface results in crystalline defects at the interfaces between the regions and the active layer 2. Those interface defects also increase source resistance despite the relatively high doping of the source region, limiting the performance improvement that can be achieved with this structure and method.

FIGS. 11(a)-11(d) schematically illustrate in cross-sectional views another method of making the FET structure of FIG. 9 but without the electrically insulating side wall films 9a and 9b. Initially, as shown in FIG. 11(a), the active layer 2 and a high dopant concentration layer 4' are successively epitaxially grown on substrate 1. A photoresist film 11' (not shown) is deposited and an aperture is opened in the film, leaving resist mask 11j in place. Using the mask 11j, the central portion of the high dopant concentration film 4' is removed by etching, followed by removal of the mask 11j.

The remaining portions of the high dopant concentration layer 4' are source and drain regions 4a and 4b, as shown in FIG. 11(b). In order to form a gate electrode, a film 5' of the gate material is deposited on the active layer 2 between source and drain regions 4a and 4b as well as on those source and drain regions. A photoresist mask 11k having a width equal to the width of the gate electrode is formed by photolithographic patterning of a photoresist film 11'' (not shown) on the gate metal film 5'. The mask 11k is substantially centered between the source and drain regions 4a and 4b.

As shown in FIG. 11(c), after etching of the gate metal film 5' to define the gate electrode 5, the resist pattern 11k is removed. The FET structure is completed by the formation of the drain and source electrodes 7 and 8.

In the manufacturing method of FIGS. 11(a)-11(d), a desirably high dopant concentration can be achieved in the source and drain regions 4a and 4b because the layer 4' is epitaxially grown rather than being formed by ion implantation. Crystalline defects at the interface between the active layer 2 and layer 4' are significantly lower than those in the process described with respect to FIGS. 10(a)-10(d) because the surface is not subjected to a plasma before growth of layer 4'. However, the formation of the gate electrode in the step illustrated in FIG. 11(b) is extremely difficult. The gate metal film 5' has a concavity between the source and drain regions 4a and 4b where the photoresist mask 11k is formed. Since the thickness t of the photoresist film 11" from which the mask 11k is formed varies significantly with position between the source and drain regions, i.e., is not planar, it is very difficult to form the photoresist mask accurately in both position and width. Usually, the photoresist film 11" is exposed to monochromatic light before development to form mask 11k. As is well known, the use of monochromatic light with a thin film of variable thickness, like the photoresist film 11", can produce light interference, resulting in variations in the exposure of the photoresist film with the thickness t. As a result, as shown in FIG. 12, the width 1 of the mask has a sinusoidal variation with the thickness of the photoresist film. In order to obtain a mask 11k of desired width 1 in a desired position on gate metal film 5', it is important that the thickness of the photoresist film 11" and the mask width be carefully coordinated. As a result, it is very difficult to control the process of FIGS. 11(a)-11(d) and to repeatedly produce FETs having the same characteristics using that process.

SUMMARY OF THE INVENTION

It is an object of the invention to provide a compound semiconductor field effect transistor and a method for easily manufacturing the compound semiconductor field effect transistor having a low source resistance and avoiding leakage current flowing through the substrate between the source and drain regions.

It is another object of the invention to provide a compound semiconductor field effect transistor and a method for easily manufacturing the compound semiconductor field effect transistor having a low source resistance, an increased gate-to-drain breakdown voltage, an increased upper limit operating frequency, and high power efficiency.

A further object of the invention is to provide a dual gate integrated compound semiconductor field effect transistor structure particularly for forming an inverter circuit.

Still another object of the invention is to provide a method for manufacturing a dual gate integrated compound semiconductor field effect transistor structure particularly for an inverter circuit.

One field effect transistor according to the invention includes a semi-insulating first compound semiconductor substrate having a surface, a first compound semiconductor active layer disposed at the surface of the substrate and having a first dopant concentration, a gate electrode disposed on the active layer, an epitaxial second compound semiconductor etch-stopping layer, different from the first compound semiconductor layer, spaced from the gate electrode and disposed on part of the active layer, an epitaxial first compound semiconductor source region disposed on the etch-stopping layer wherein the etch-stopping layer and the drain region have a second dopant concentration higher than the first dopant concentration, a source electrode disposed on the source region, a drain region disposed in the substrate adjacent to and in contact with the active layer on an opposite side of the gate electrode from the source region having a dopant concentration intermediate the dopant concentrations of the source region and the active layer, and a drain electrode disposed on said drain region.

Another field effect transistor according to the invention includes a semi-insulating first compound semiconductor substrate having a surface, a first compound semiconductor active layer disposed at the surface of the substrate and having a first dopant concentration, a gate electrode disposed on the active layer, an epitaxial first compound semiconductor source region disposed on part of the active layer spaced from the gate electrode wherein the source region has a second dopant concentration higher than the first dopant concentration, a source electrode disposed on the source region, an electrically insulating layer disposed on the active layer between and contacting the source region and the gate electrode, a drain region disposed in the substrate adjacent to and in contact with the active layer on an opposite side of the gate electrode from the source region having a dopant concentration intermediate the dopant concentrations of the source region and the active layer, and a drain electrode disposed on said drain region.

According to another aspect of the invention, a method of manufacturing a field effect transistor includes sequentially epitaxially growing on a semi-insulating compound semiconductor substrate an active layer of the first compound semiconductor having a first dopant concentration and a source layer of the first compound semiconductor having a second dopant concentration higher than the first dopant concentration, removing part of the source layer to leave a source region on the substrate, forming a gate electrode on the active layer spaced from the source region, forming a drain region in the substrate spaced from the gate electrode, on the opposite side of the gate electrode from the source region, adjacent to and in contact with the active layer and having a dopant concentration intermediate the dopant concentrations of the active layer and the source region, and forming source and drain electrodes on the source and drain regions, respectively.

According to the invention, another method of manufacturing a field effect transistor includes sequentially epitaxially growing on a semi-insulating compound semiconductor substrate an active layer of the first compound semiconductor having a first dopant concentration and a source layer of the first compound semiconductor having a second dopant concentration higher than the first dopant concentration, removing part of the source layer to leave a source region on the substrate, depositing an electrically insulating film on the active layer and on and covering the source region, etching the electrically insulating film to remove it from the source region and from part of the active layer, leaving first and second side wall films of the electrically insulating film disposed on the active layer and adjacent to and contacting each of two opposed side walls of the source region, depositing a gate electrode material layer on the active layer and on and covering the source region and the first and second side wall films, etching the gate electrode material layer to remove it from the source region and from part of the active layer, leaving first and second side wall gate electrodes disposed on the active layer and adjacent to and contacting the first and second side wall films, respectively, removing the first side wall gate electrode, leaving the second side wall gate electrode in place as a gate electrode, forming a drain region in the substrate, spaced from the gate electrode, on the opposite side of the gate electrode from the source region, adjacent to and in contact with the active layer, and having a dopant concentration intermediate the dopant concentrations of the source region and the active layer and forming source and drain electrodes on the source and drain regions, respectively.

Other objects and advantages of the present invention will become apparent from the detailed description given hereinafter. The detailed description and specific embodiments described are provided for illustration only since various additions and modifications within the spirit and scope of the invention will become apparent to those skilled in the art from the detailed description.

BRIEF DESCRIPTION OF THE DRAWINGS

FIGS. 6(a)–6(d) are schematic cross-sectional views illustrating a method of manufacturing the structure of FIG. 5(a).

DETAILED DESCRIPTION OF PREFERRED EMBODIMENTS

Figure 1:
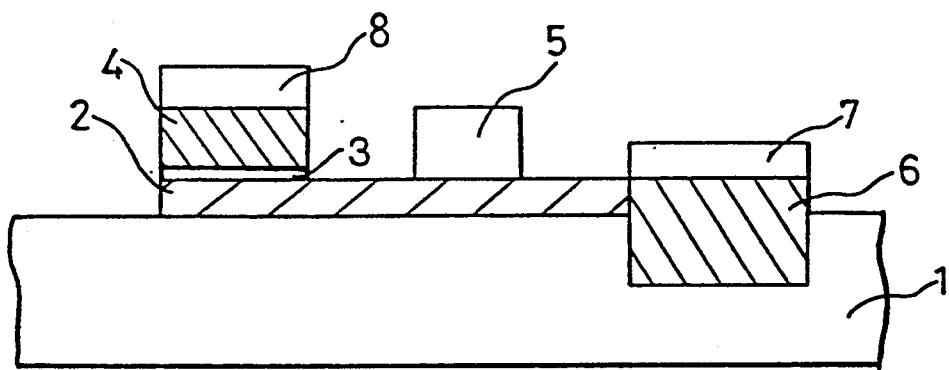
FIG. 1 is a schematic cross-sectional view of an FET in accordance with an embodiment of the invention.

FIG. 1 is a cross-sectional view of an FET structure in accordance with an embodiment of the invention. In that structure, a semi-insulating GaAs substrate 1 has a surface on which a relatively low dopant concentration, n-type GaAs active layer 2, preferably prepared by epitaxial growth, is disposed. For convenience, the relative dopant concentration of layer 2 is designated n. A gate electrode 5, which may be a refractory metal silicide such as $WSi_x$, is disposed on the active layer 2. A relatively highly doped, i.e., $n^{++}$, n-type GaAs source region 4 is disposed on a highly doped n-type compound semiconductor etch-stopping layer 3 which, in turn, is disposed on the active layer 2. The etch-stopping layer 3 may be aluminum gallium arsenide (AlGaAs) or indium gallium arsenide (InGaAs) when, as preferred, the n-type source region 4 is GaAs. At the opposite end of the active layer 2 on the opposite side of the gate electrode 5 from the source region 4, an n-type GaAs drain region 6 of intermediate dopant concentration, i.e., $n^+$, is disposed in the substrate 1, adjacent to and in contact with the active layer 2. The metal drain electrode 7 is disposed on the drain region 6 and the metal source electrode 8 disposed on the source region 4. In a typical structure, the dopant concentration of the source region 4 is approximately $1 \times 10^{19}$ cm$^{-3}$, of the drain region 6 is approximately $2 \times 10^{18}$ cm$^{-3}$, and of the active layer 2 is approximately $2 \times 10^{17}$ cm$^{-3}$.

Figure 2A:
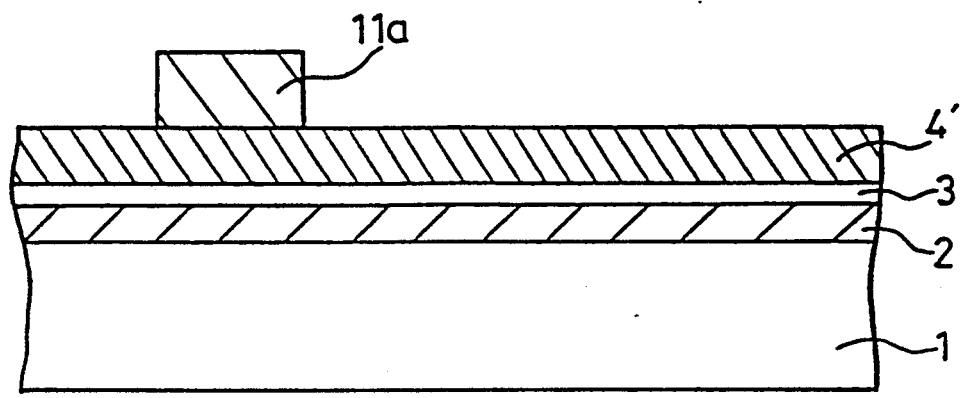
FIGS. 2(a)–2(f) are cross-sectional views illustrating a method of manufacturing the FET of FIG. 1.

A method of making the FET structure of FIG. 1 is illustrated in the schematic cross-sectional views of FIGS. 2(a)–2(f). Initially, as shown in FIG. 2(a), the GaAs active layer 2, the etch-stopping layer 3 of AlGaAs or InGaAs, and the most heavily doped layer, GaAs layer 4', are successively epitaxially grown on the semi-insulating GaAs substrate 1. Typically, the active layer 2 is about 0.1 micron thick, the etch-stopping layer 3 is about 0.05 micron thick, and the heavily doped layer 4' is about 0.2 micron thick. A photoresist layer 11' (not shown) is deposited on layer 4' and formed into a resist pattern 11a on a portion of the heavily doped layer 4' by conventional photolithographic techniques.

Figure 2B:
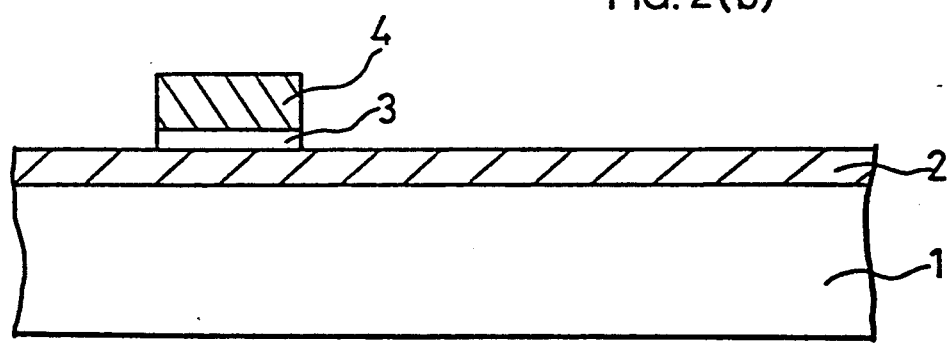
Figure 2C:
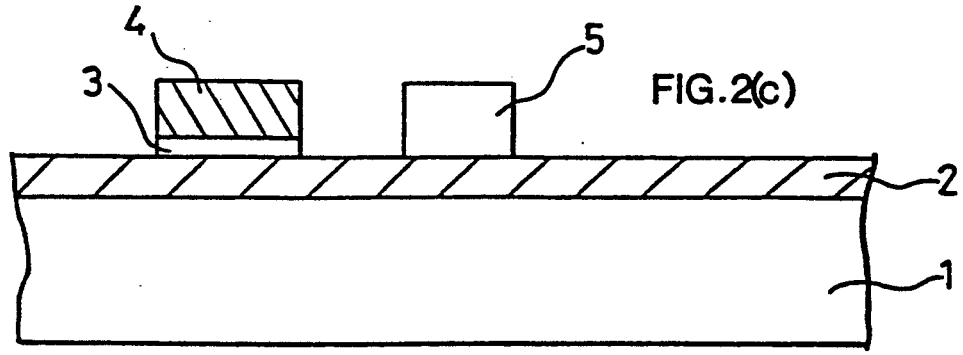

As illustrated in FIG. 2(b), the mask 11a is employed for RIE of the heavily doped layer 4' and the etch-stopping layer 3. When the etch-stopping layer 3 is AlGaAs, the RIE may be typically carried out using chlorine as an etchant species at a gas pressure of 0.25 Torr with a gas flow rate of 10 standard cubic centimeters per minute (sccm). When, during etching, the etch-stopping layer 3 is exposed, aluminum species enter the RIE plasma and are spectroscopically detected from characteristic light wavelength emission of the aluminum species. Upon detection of aluminum in the plasma, the etching is terminated. Because the etch-stopping layer 3 is so thin, essentially all of the etch-stopping layer beyond the mask 11a is removed in the termination of the RIE process. Thereafter, the mask 11a is removed to produce the structure shown in FIG. 2(b).

The gate electrode 5 is formed by depositing the gate material, which may be a refractory metal silicide, a refractory metal, or tungsten nitride, for example, on the surface of the active layer 2 as well as on source region 4 by sputtering or another process. The excess gate material is removed by masking and etching so that the gate electrode 5, which may have a sub-micron gate length, is formed. Because of the use of the photolithographic process, the spacing between the source region 4 and the gate electrode 5 should be 0.5 to 1 micron depending upon the alignment precision of the photolithographic apparatus employed.

A drain region 6 is produced by ion implantation. In order to protect the active layer 2 and the other elements of the FET structure outside the drain region during ion implantation, a photoresist film 11" (not shown) is deposited on the entire structure. An aperture is opened in the film 11" to expose an area of the active layer 2 spaced approximately 0.5 to 1 micron from the gate electrode 5 where the drain region is to be formed in the substrate 1. This patterning leaves photoresist mask 11b in place. Ions producing n-type doping, such as silicon ions when the substrate 1 is GaAs, are then implanted in the active layer 2 and substrate 1 using the resist pattern 11b as a mask to produce a dopant concentration of about $2 \times 10^{18}$ cm$^{-3}$. After removal of mask 11b, the surface of the structure is lightly etched with hydrofluoric acid (HF) to remove any damage that may have been produced during the ion implantation step.

While this description of a method for making the structure of FIG. 1 is directed to a single FET structure, in practice, many such FETs are usually made simultaneously on a single semiconductor wafer. In order to electrically isolate the FETs on the wafer from each other, still another photoresist film 11''' (not shown) is deposited on the surface and patterned to form a mask 11c, as shown in FIG. 2(e). In that figure, the mask 11c extends exactly to the outer surfaces of the source region 4 and drain region 6 but absolute alignment precision of the mask with those surfaces is not required. Nevertheless, after etching to remove the portions of the active layer 2 that lie outside the mask 11c, the side surfaces of the mask and of the source region 4 and drain region 6 will be effectively aligned with the mask 11c.

After removal of the mask 11c, the structure is annealed for approximately thirty minutes at 800° Centigrade consistent with the ion implantation step in which the drain region was formed. Finally, the device structure is completed by the formation of the drain and source electrodes 7 and 8 on the respective drain and source regions, as shown in FIG. 2(f).

Figure 11A:
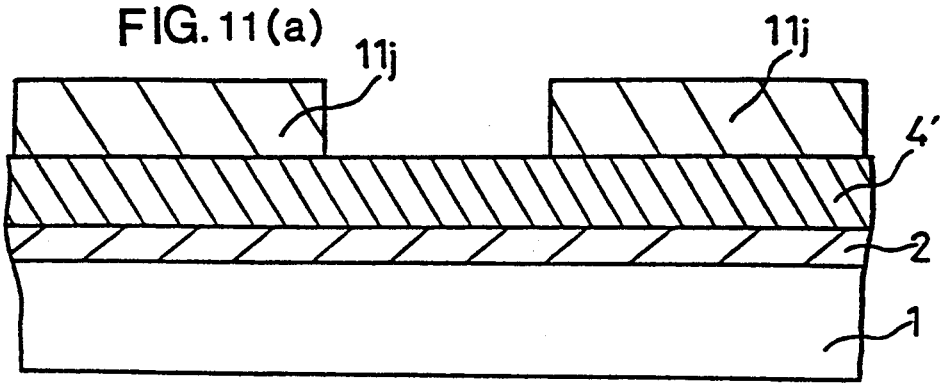
FIGS. 11(a)–11(d) are cross-sectional views illustrating a method of manufacturing the conventional FET structure of FIG. 9.
Figure 11B:
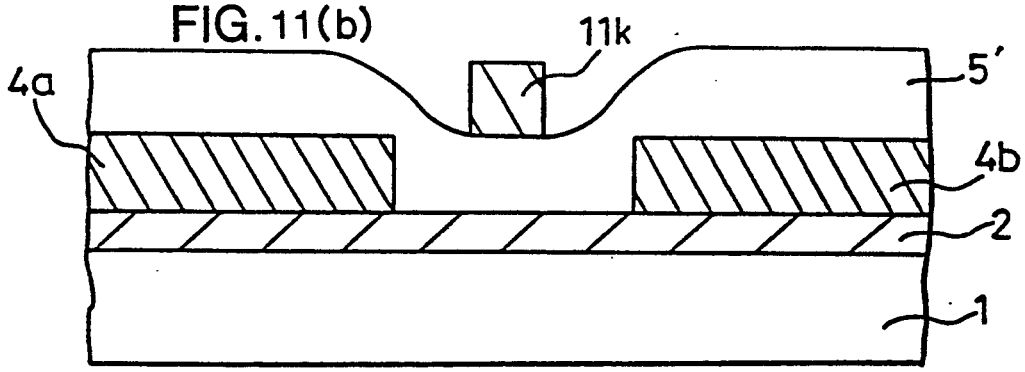
Figure 11C:
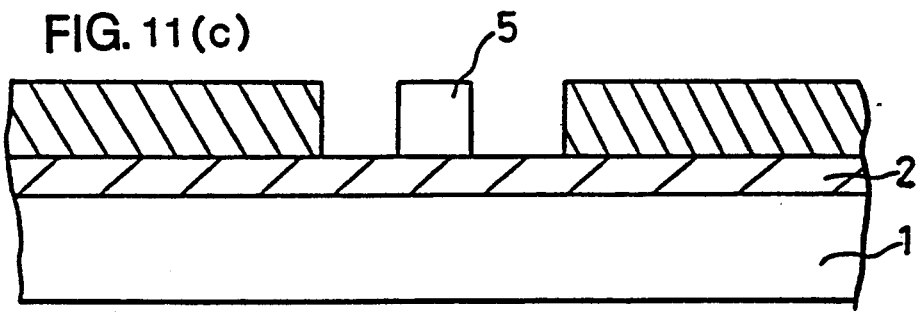
Figure 11D:
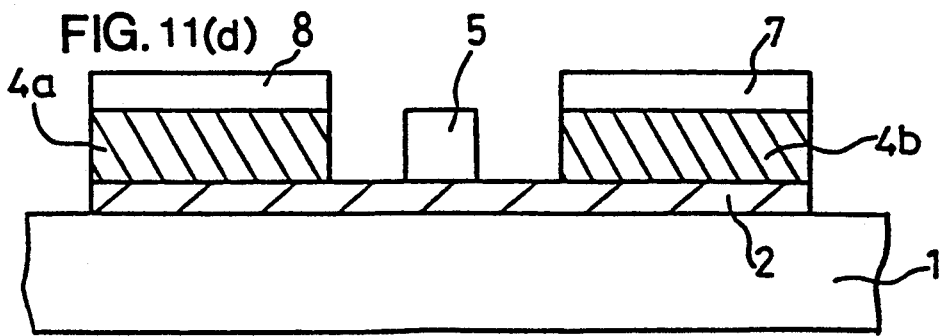
Figure 12:
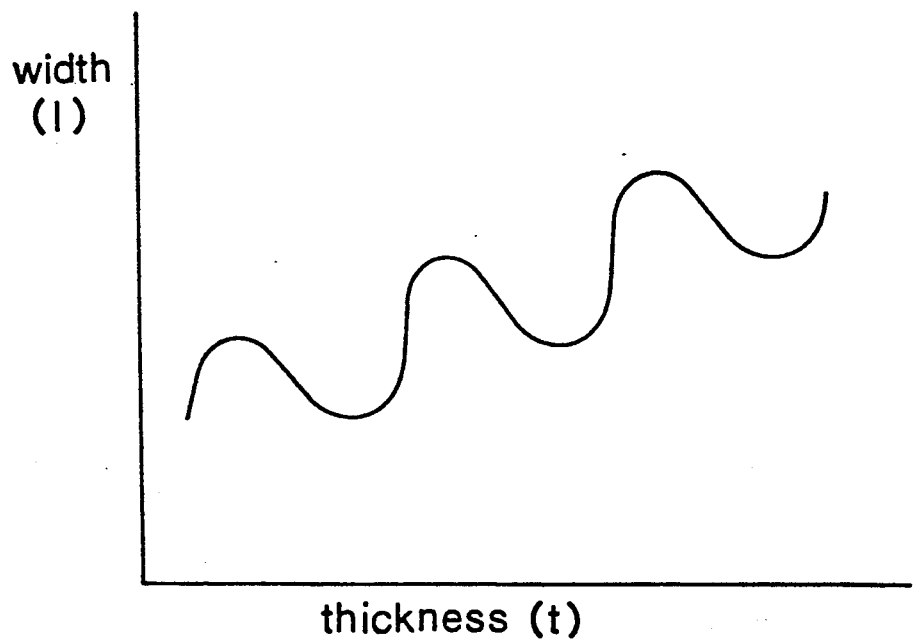
FIG. 12 is a graph showing the relationship between a gate mask width and the thickness of the mask for the process step illustrated in FIG. 11(b).

The FET thus formed has significant advantages over the prior art structures. Since the source region 4 and the drain region 6 are independently formed, they can have different dopant concentrations. Since the source region is formed by epitaxial growth, it can have a relatively high dopant concentration, i.e., higher than can be achieved by ion implantation, and, therefore, a desirably low resistance. The relatively low dopant concentration active region intervenes in any current path through the substrate 1 between the source and drain regions so that the flow of leakage current due to defects in the substrate is prevented. In addition, because layers 2, 3, and 4 are successively epitaxially grown without interruption, interface defects between them are significantly reduced, contributing to a reduction in the source resistance. The employment of the etch-stopping layer 3 permits accurate control of the etching process in which the source region 4 is formed so that the active layer 2 is not significantly damaged by excessive etching. Moreover, since no layers are grown on the active layer 2 after removal of part of the source layer 4' by etching, no crystalline defects due to etching damage affect the crystallinity of other layers. Finally, since the gate electrode is formed on a planar surface, rather than a non-planar surface as in the process illustrated in FIG. 11(b), the gate electrode 5 can be repeatedly produced with a high degree of uniformity in position and width.

Figure 2D:
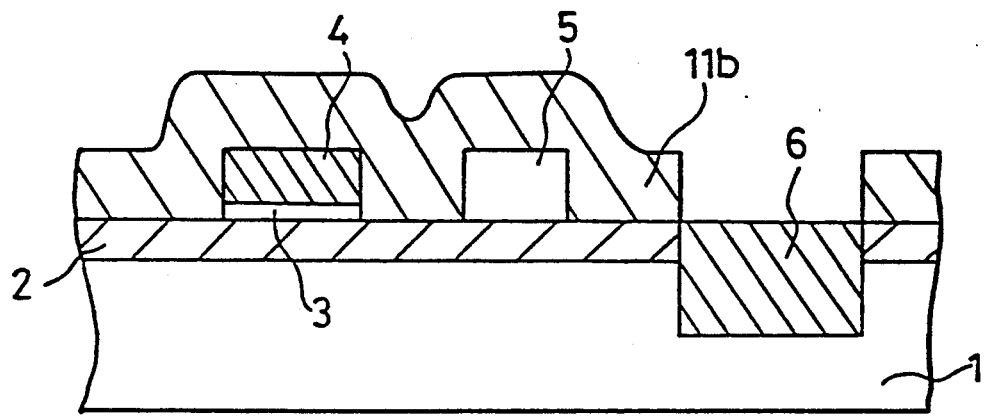
Figure 2E:
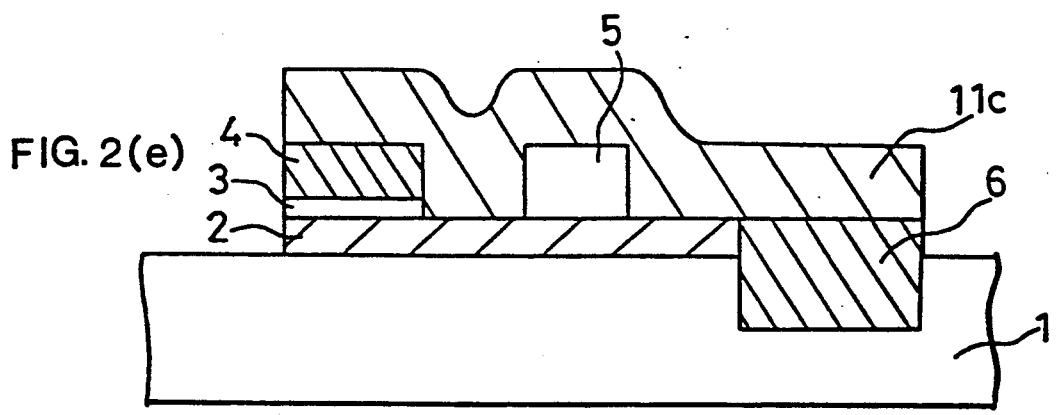
Figure 2F:
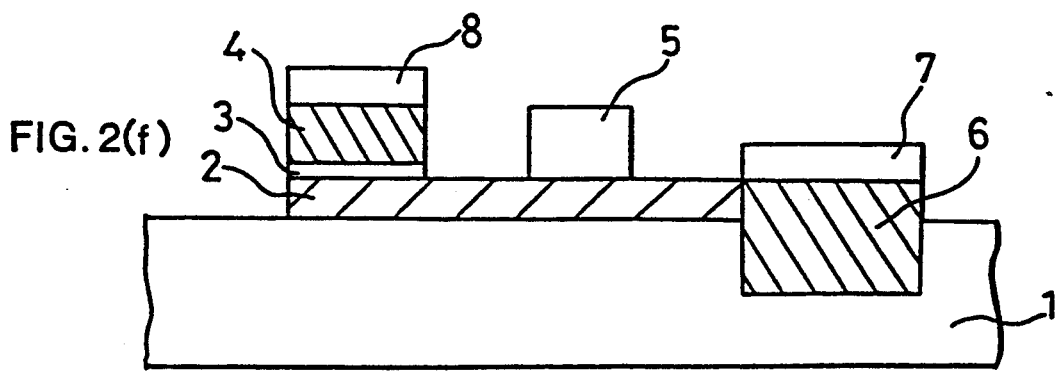

As an alternative to the ion implantation step of FIG. 2(d), an n-type dopant impurity, including silicon, can be diffused through the opening in mask 11b to form the drain region 6. While FIGS. 2(a)-2(f) and other figures are described as employing GaAs in the substrate 1, the active layer 2, and the source region 4, indium phosphide (InP) and other compound semiconductors can also be used to form FET structures according to the invention.

Figure 3:
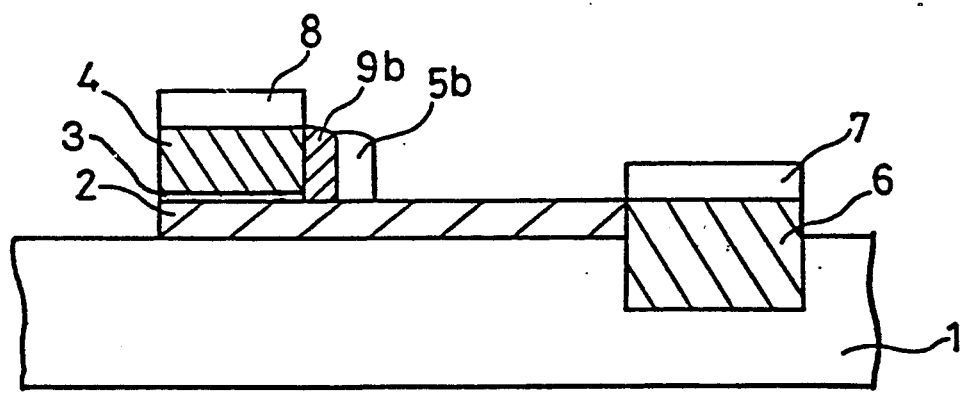
FIG. 3 is a schematic cross-sectional view of an FET in accordance with an embodiment of the invention.

FIG. 3 is a schematic cross-sectional view of an alternative FET structure according to an embodiment of the invention. The structure of FIG. 3 is similar to that of FIG. 1 except that the gate electrode 5b is much closer to the source region 4 and is separated from the source region 4 by an insulating side wall film 9b disposed on the active layer 2 and contacting side walls of the source region 4 and of the gate electrode 5b. A method of manufacturing the FET structure of FIG. 3 is illustrated in schematic cross-sectional views in FIGS. 4(a)-4(i).

Figure 4A:
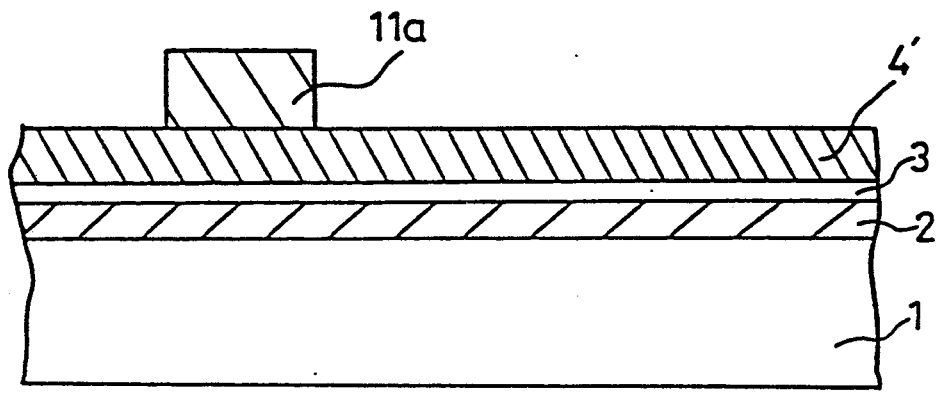
FIGS. 4(a)–4(i) are cross-sectional views illustrating a method of manufacturing the FET of FIG. 3.
Figure 4B:
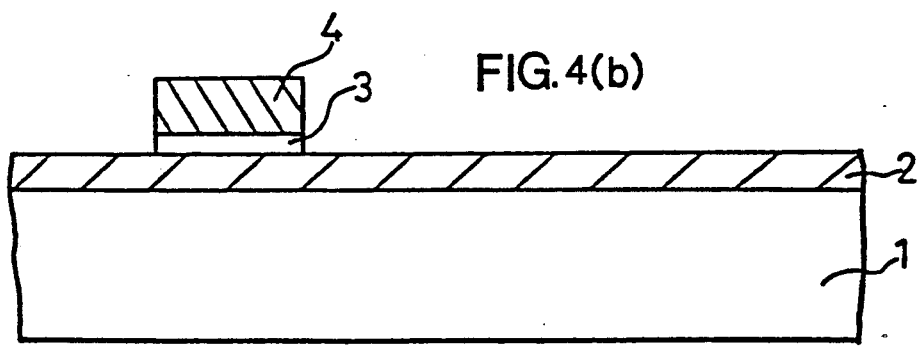
Figure 4C:
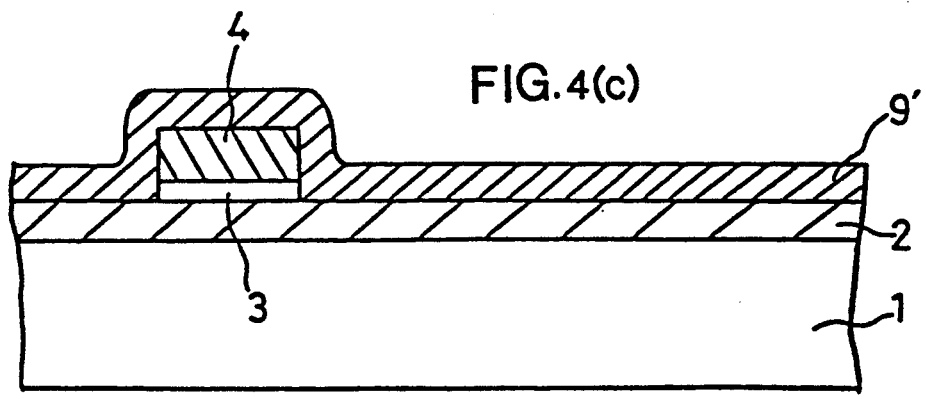

The process steps illustrated in FIGS. 4(a) and 4(b) are the same as those illustrated in FIGS. 2(a) and 2(b) and, therefore, do not require additional explanation. In FIG. 4(c), an electrically insulating film 9, has been deposited on the surface of the active layer 2 and on and covering the source region 4. The electrically insulating film 9' may be, for example, $SiO_x$, where x ranges from 1 to 2, or SiN.

Figure 4D:
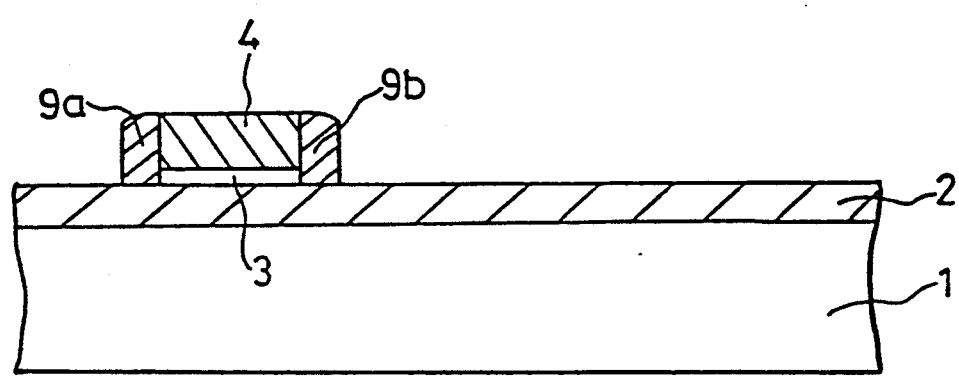

As illustrated in FIG. 4(d), the insulating film 9' is etched, for example, by RIE, leaving residual side wall films 9a and 9b, disposed on the active layer 2 and contacting each of two opposed side walls of the source region 4. As is known in the art, the widths of the residual side wall films 9a and 9b are approximately equal to the thickness of the insulating film 9' as deposited remotely from the source region 4. That thickness can easily be controlled to be as thin as 0.05 micron.

Figure 4E:
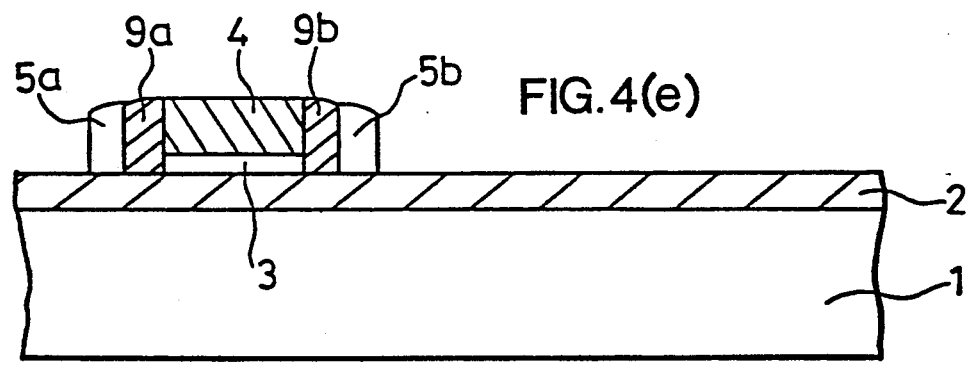
Figure 4F:
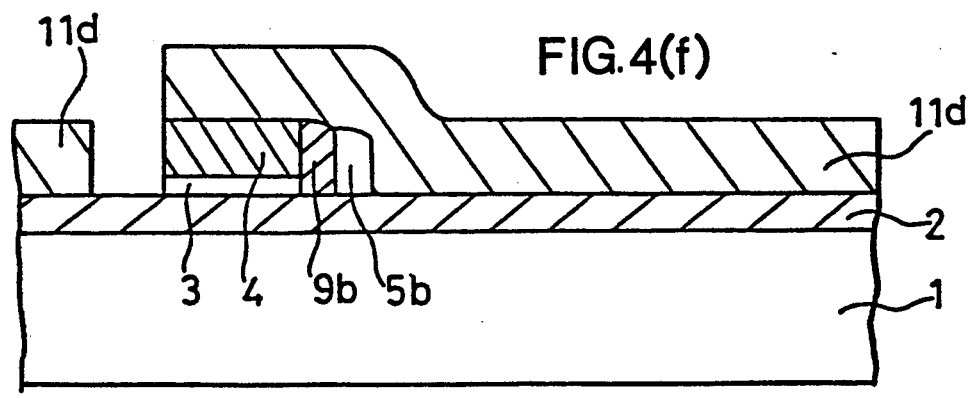

The film deposition and RIE steps are repeated to form the side wall gate electrodes 5a and 5b shown in FIG. 4(e). Those side wall gate electrodes of a refractory metal or a refractory metal silicide are formed by RIE of a film of the gate material deposited on the active layer 2 and covering the source region 4 and the side wall films 9a and 9b. A typical width, i.e., gate length, of the side wall gate electrodes 5a and 5b is roughly equal to the thickness of the gate material layer and may be 0.5 micron or less. In forming the gate electrodes, the RIE remote from the sectioning plane of the cross-section shown in FIG. 4(e) leaves contact pads on the surface of the active layer 2.

The side wall film 9a and the side wall gate electrode 5a are removed to form a single gate FET structure with the side wall gate electrode 5b as the gate electrode. A photoresist film 11' (not shown) is deposited and an aperture opened in the photoresist film using photolithographic techniques to form the mask 11d shown in FIG. 4(f) and to expose the side wall gate electrode 5a and side wall film 9a. The side wall gate electrode 5a and the side wall film 9a are removed by RIE or another etching technique. The aperture formed in the photoresist film need not be precisely aligned with the junction between the source region 4 and the side wall film 9a, but any error in mask alignment should be controlled so that all of the side wall gate electrode 5a is removed even if a portion of the side wall 9a remains or a portion of the source region 4 and the etch-stopping layer 3 are removed in the etching.

Figure 4G:
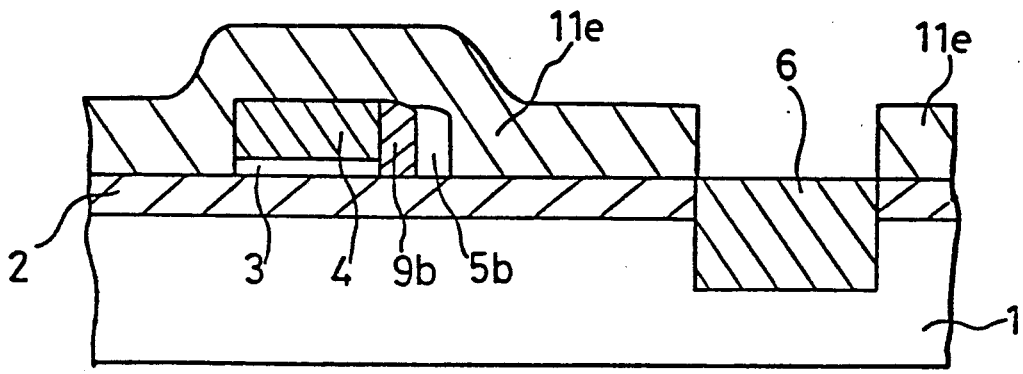

After removal of the photoresist pattern 11d, another photoresist film 11'' (not shown) is deposited and patterned by the opening of an aperture for the formation of the drain region 6 to form the mask 11e, as shown in FIG. 4(g). The mask 11e exposes a portion of the area of the active layer 2. Generally, the opening in the mask 11e is spaced 0.5 to 1 micron from the gate electrode 5b. Ions producing n-type conductivity, such as silicon ions in a GaAs active layer 2 and substrate 1, are implanted, using the resist pattern 11e as a mask, to form the drain region 6.

Figure 4H:
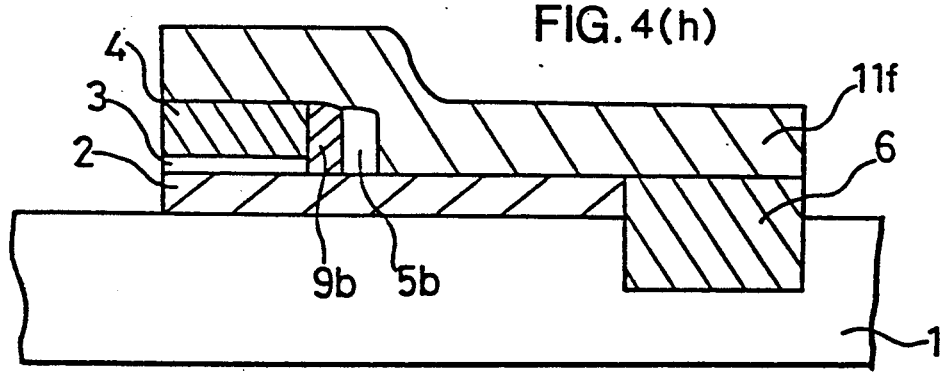
Figure 4I:
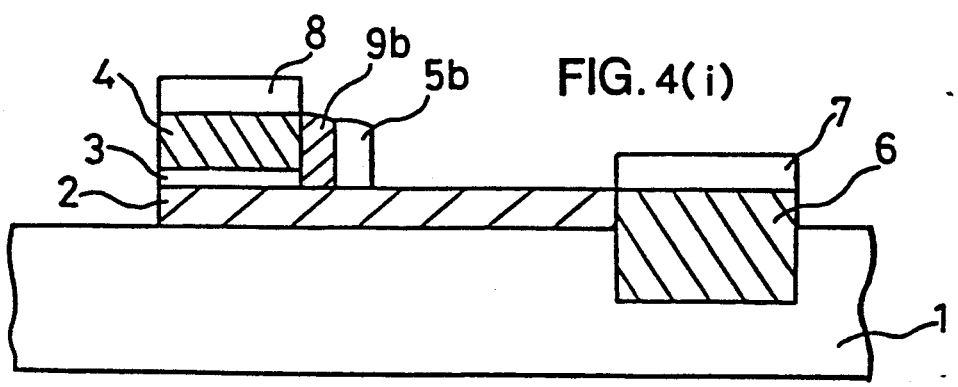

As described for FIG. 2(f), in the step illustrated in FIG. 4(h), still another photoresist film 11''' is deposited, a mask 11f is formed from the film, and etching is carried out to isolate the FET from other FETs or other electronic devices formed on the same wafer. The isolation is achieved by removing portions of the active layer 2 from the substrate that lie beyond the area between the source region 4 and the drain region 6. Finally, metallic drain and source electrodes 7 and 8 are formed on the drain region 6 and the source region 4, respectively, to complete the structure, as shown in FIG. 4(i). While the source electrode 8 is shown as extending across the entire width of the source region 4, that electrode may be narrower to ensure that there is no short-circuit between the source electrode 8 and the gate electrode 5b.

The structure of FIGS. 3 and 4(i) provides substantial improvements over the prior art. Since the insulating film 9b and the gate electrode 5b are formed using side walls, the source region 4 is completely insulated from the gate electrode while the spacing between the source region 4 and the gate electrode 5b is as short as possible and is not limited by the precision of mask alignment. Moreover, the spacing between the source region and the gate is not dependent upon the alignment precision of photolithographic processes. Since, as in the structure of FIG. 1, the source region may be relatively highly doped because it is epitaxially grown, the source resistance is reduced over prior art FETs. Finally, because the gate length of the gate 5b is so short, the FET occupies a relatively small area and a high integration density can be achieved, the upper limit operating frequency can be increased, and the power efficiency is improved.

Figure 5A:
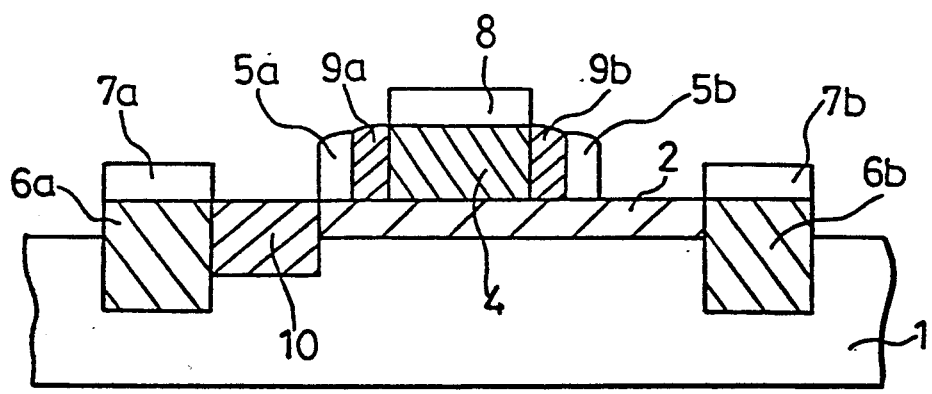
FIGS. 5(a) and 5(b) are a schematic cross-sectional view of a semiconductor device structure for an inverter circuit in accordance with an embodiment of the invention and a schematic view of an inverter circuit using the structure of FIG. 5(a), respectively.
Figure 5B:
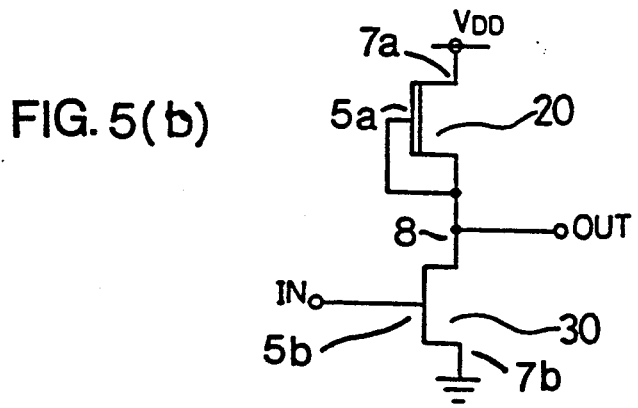

FIG. 5(a) is a schematic cross-sectional view of a dual gate FET structure that, with appropriate interconnections, functions as an inverter. A schematic diagram of such an inverter circuit is shown in FIG. 5(b). In FIG. 5(b), FET 20, which corresponds to the left half of the structure of FIG. 5(a), is a depletion-type FET and FET 30, which corresponds to the right half of the structure of FIG. 5(a), is an enhancement-type FET. In FIG. 5(b), the elements of the structure shown in FIG. 5(a) are given the same reference numbers for convenience in comparing the two figures. The connection between the gate electrode 5a of FET 20 and the common source electrode 8 shown in FIG. 5(b) is not shown in FIG. 5(a). That connection can be made at connection pads that are remote from the section shown in FIG. 5(a) or can be made by extending the source electrode 8 to overlap with and contact the gate electrode 5a.

The structure of FIG. 5(a) includes a doped region 10 of intermediate doping concentration disposed between the active layer 2 of relatively low dopant concentration and the intermediate dopant concentration drain region 6a to form the depletion-type FET 20. Otherwise, all of the elements of the structure of FIG. 5(a) have previously been identified except that the two drain electrodes, identified as 7a and 7b, and the two drain regions, identified as 6a and 6b, are present. As in the structure of FIG. 3, the spacing between the source region 4 and the two gate electrodes 5a and 5b is minimized and is not dependent upon the precision of photolithographic mask alignments. Leakage current flow between the common source region 4 and the regions 7a and 7b is prevented by the interposition of the active layer 2 and the intermediate dopant concentration doped region 10 between the source region and drain regions.

Figure 13:
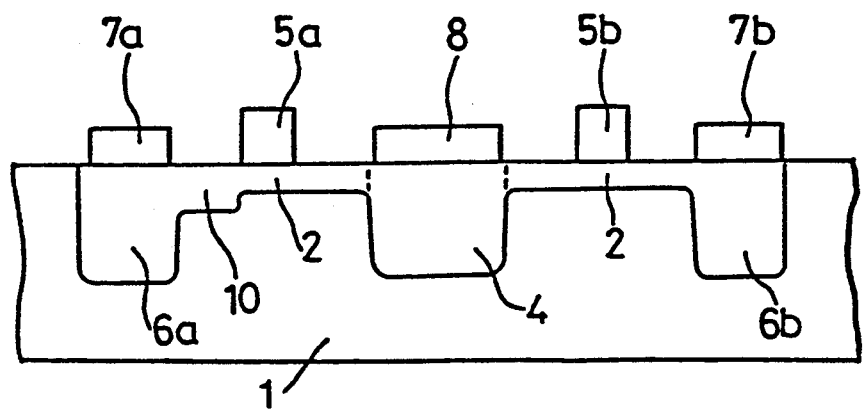
FIG. 13 is a schematic cross-sectional view of a conventional dual gate FET structure.

For comparison, a conventional dual gate FET structure that may be employed as the inverter circuit of FIG. 5(b), when appropriate electrical connections are made, is shown in a schematic cross-sectional view in FIG. 13. In that conventional structure, each of the doped regions within the substrate 1 is formed by ion implantation. The gate electrodes 5a and 5b are formed using photolithographic techniques. Thus, like the prior art single FET structures, the dual gate structure of FIG. 13 suffers from current leakage through the substrate, a relatively high source region resistance, and a relatively low upper limit operating frequency because of the length of the gates and their relatively large spacing from the source region. All of these problems are overcome by the features of the invention that are part of the structure of FIG. 5(a) and that have already been described.

Figure 6A:
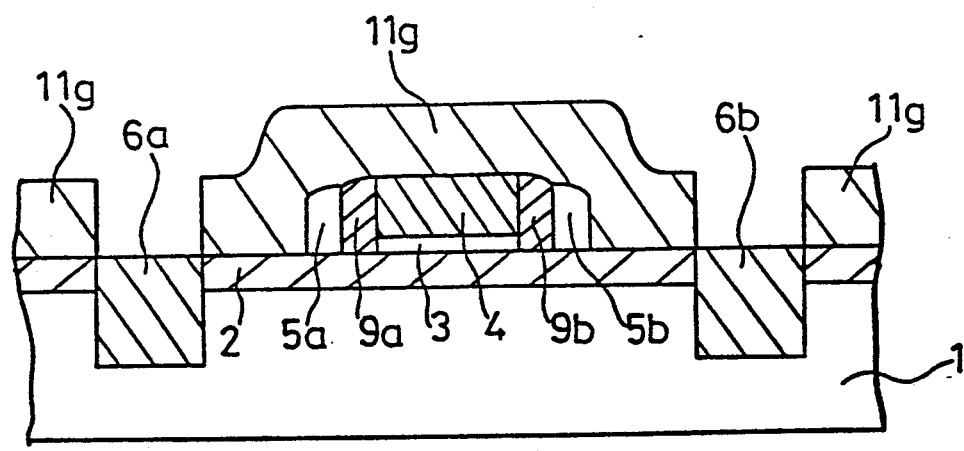

FIGS. 6(a)-6(d) show important steps in a method for producing the structure of FIG. 5(a). Initially, the processes illustrated by FIGS. 4(a)-4(e) are carried out. Since those processes have already been described, it is not necessary to describe them again. After the formation of the structure shown in FIG. 4(e), yet another photoresist layer 11' (not shown) is deposited and formed into a mask 11g by opening two apertures lying on opposite sides of the source region 4 and spaced from the respective gate electrodes 5a and 5b, as shown in FIG. 6(a). The drain regions 6a and 6b are formed by ion implantation, just as described for the other structures, using mask 11g to control the implanted areas.

Figure 6B:
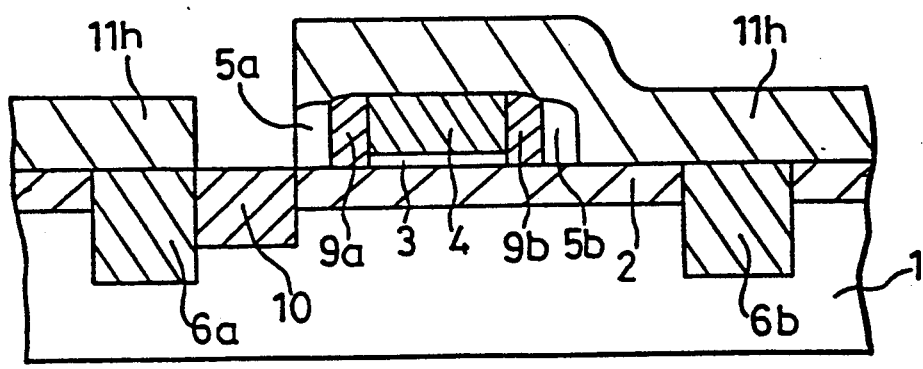

After removal of the mask 11g, a further photoresist layer 11' (not shown) is deposited over the entire surface of the structure and an aperture is opened in the layer, thereby forming ion implantation mask 11h of FIG. 6(b). The opening in the mask 11h is generally aligned with the outside edge of the gate electrode 5a. If the aperture in the mask 11h should extend into the region of the gate electrode 5a, that gate electrode acts as an ion implantation mask so that the second ion implantation step is self-aligning with respect to that gate electrode. The doped region 10 is then formed by ion implantation using the mask 11h as an ion implantation mask. The doped region 10 has a dopant concentration intermediate that of the active layer and the drain region 6a.

In FIG. 6(c), insolation is accomplished by masking and removing the active layer 2 beyond the two drain regions 6a and 6b. The isolation step is analogous to the steps illustrated in FIGS. 2(e) and 4(h). Finally, after removal of mask 11i used in the isolating step and any annealing necessary in conjunction with the ion implantation steps, source electrode 8 and drain electrodes 7a and 7b are deposited, completing the structure.

Figure 7A:
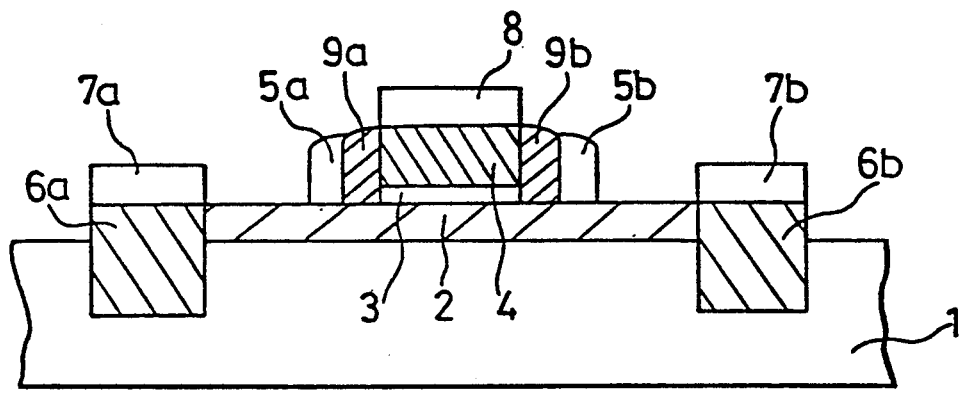
FIGS. 7(a) and 7(b) are schematic cross-sectional views of dual gate FET structures in accordance with embodiment of the invention.
Figure 7B:
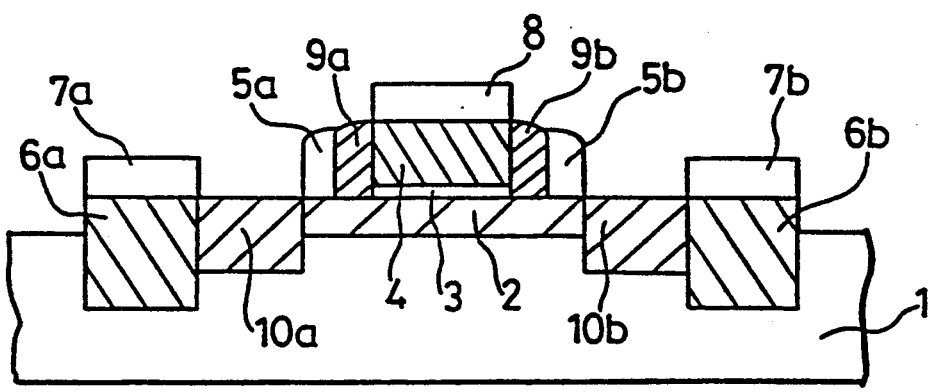
Figure 8:
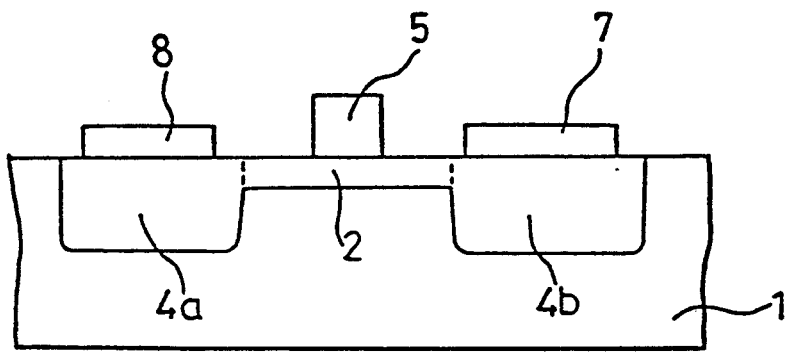
FIGS. 8 and 9 are schematic cross-sectional views of conventional FET structures.
Figure 9:
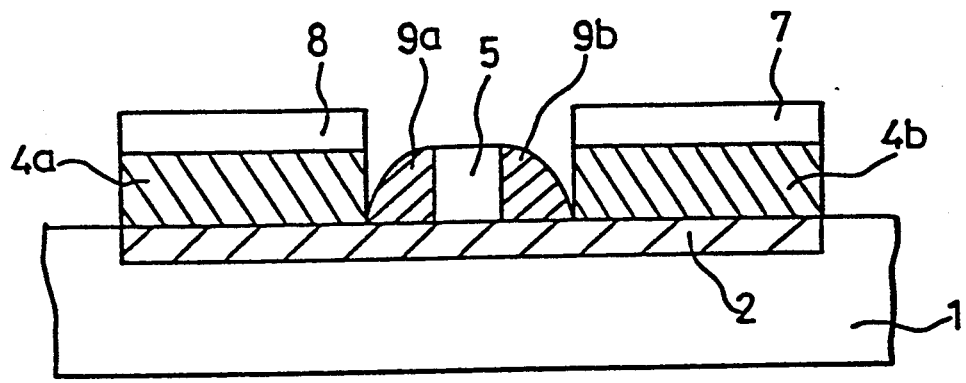
Figure 10A:
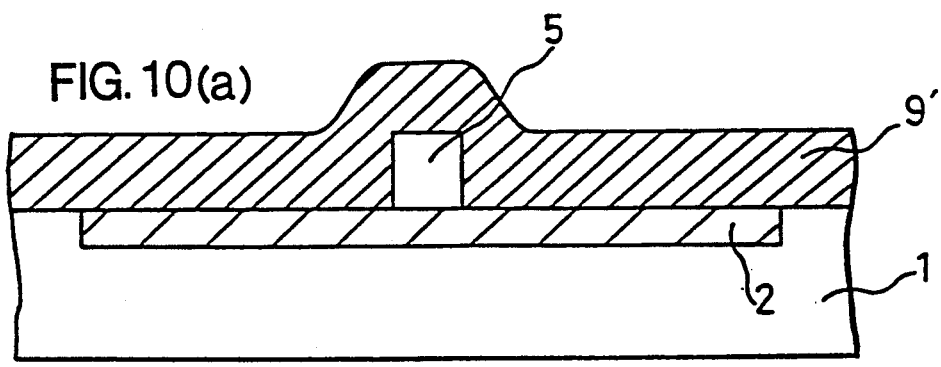
FIGS. 10(a)–10(d) are cross-sectional views illustrating a method of manufacturing the conventional FET structure, of FIG. 9.
Figure 10B:
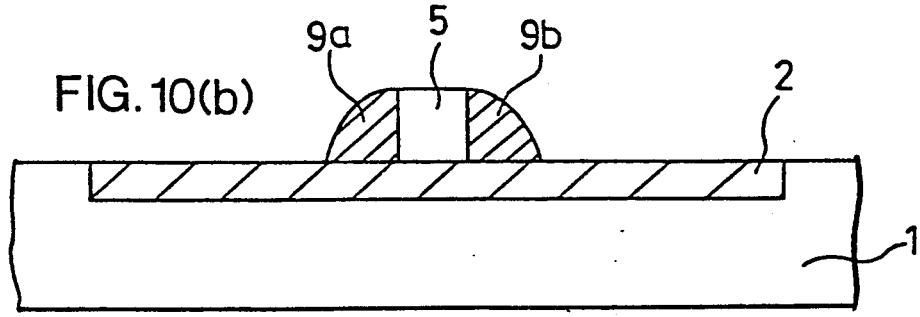
Figure 10C:
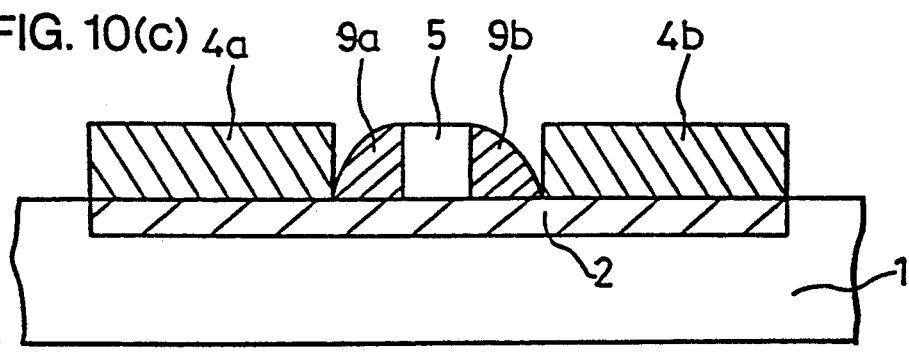
Figure 10D:
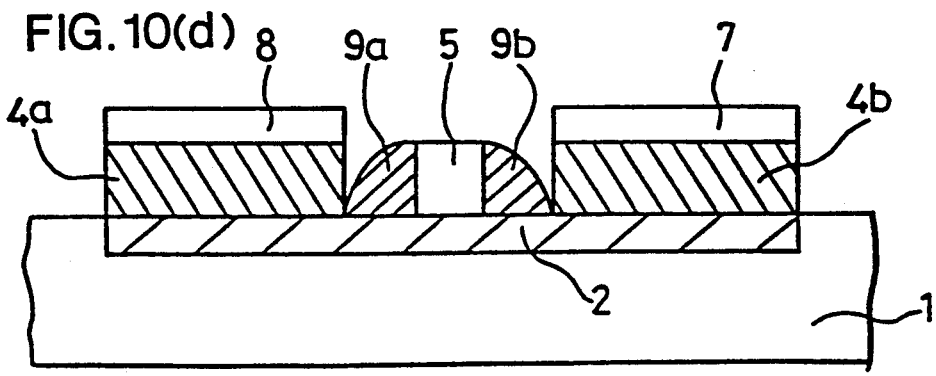

The structure of FIGS. 5(a) and 6(d), which may be employed as an inverter, incorporates one depletion-type FET and one enhancement-type FET. Related dual gate structures incorporating two enhancement-type or two depletion-type FETs can be easily made. Examples of such structures are shown in FIGS. 7(a) and 7(b), respectively. Two enhancement-type FET structures with a common source region, i.e., a dual gate enhancement-type FET, are shown in a schematic cross-sectional view in FIG. 7(a). In FIG. 7(b), each of two depletion-type FETs includes intermediate dopant concentration doped regions 10a and 10b disposed between the active layer 2 and the respective drain regions 6a and 6b. The FETs have a common source region but separate gate and drain electrodes. As with the structure of FIG. 5(a), the structures of FIGS. 7(a) and 7(b) can be prepared with a high integration density, producing high speed performance that is especially suitable for use in linear GaAs integrated circuits. Although, in the structures of FIGS. 4(i), 6(d), 7(a), and 7(b), the source electrode 8 is exactly aligned with and extends between the side walls of the source region 4, such precise alignment is not required. Rather, the electrode 8 may be narrower than the source region 4 or may be offset to one side or the other of the source region 4 so long as no unintended short-circuiting to any of the gate electrodes occurs.

The FETs described have n-type source and drain regions, n-type active layers, and n-type doped regions in the depletion-type FETs. As is understood in the art, n-type doping in FETs is preferred because the mobility of electrons is larger than that of holes. However, the invention can be applied to FETs with p-type regions, provided all of the doped elements of an FET are of the same conductivity type.

I claim:

1. A dual field effect transistor structure comprising:
   a semi-insulating first compound semiconductor substrate having a surface;
   a first compound semiconductor active layer disposed on the surface of the substrate and having a first conductivity type and a first dopant concentration;
   an epitaxial first compound semiconductor source region disposed on part of the first conductivity type active layer having a second dopant concentration higher than the first dopant concentration;
   a source electrode disposed on the source region;
   first and second gate electrodes disposed on the first conductivity type active layer on opposite sides of the source region;
   first and second electrically insulating side wall films disposed on the first conductivity type active layer between and contacting the source region and the first and second gate electrodes, respectively;
   first and second drain regions disposed in the substrate adjacent to and in contact with the first conductivity type active layer, the first drain region being disposed on the same side of the source region as the first gate electrode and the second drain region being disposed on the same side of the source region as the second gate electrode, the first gate electrode being disposed between the source region and the first drain region, spaced from the first gate electrode, and the second gate electrode being disposed between the source region and the second drain region, spaced from the second gate electrode, the first and second drain regions having dopant concentrations intermediate the dopant concentrations of the source region and the first conductivity type active layer; and
   source and first and second drain electrodes disposed on the source region and first and second regions, respectively.

2. The dual field effect transistor structure of claim 1 wherein the first compound semiconductor is selected from the group consisting of GaAs and InP and the second compound semiconductor is selected from the group consisting of AlGaAs and InGaAs.

3. The dual field effect transistor structure of claim 1 wherein the substrate is GaAs, the dopant concentration of the active layer is approximately $2 \times 10^{17}$ cm$^{-3}$, the dopant concentration of the source region is approximately $1 \times 10^{19}$ cm$^{-3}$, and the dopant concentration of the first and second drain regions is approximately $2 \times 10^{18}$ cm$^{-3}$.

4. A dual field effect transistor structure comprising:
   a semi-insulating first compound semiconductor substrate having a surface;
   a first compound semiconductor active layer disposed on the surface of the substrate and having a first dopant concentration;
   an epitaxial first compound semiconductor source region disposed on part of the active layer having a second dopant concentration higher than the first dopant concentration;
   a source electrode disposed on the source region;
   first and second gate electrodes disposed on the active layer on opposite sides of the source region;
   first and second electrically insulating side wall films disposed on the active layer between and contacting the source region and the first and second gate electrodes, respectively;
   a first drain region disposed in the substrate adjacent to and in contact with the active layer, disposed on the same side of the source region as the first gate electrode with the first gate electrode disposed between the source region and the first drain region, spaced from the first gate electrode, and having a dopant concentration intermediate the dopant concentrations of the source region and the active layer;
   a doped region disposed in the substrate adjacent to and in contact with the active layer, adjacent to the second gate electrode, on the same side of the source region as the second gate electrode with the second gate electrode disposed between the source region and the doped region, and having a dopant concentration intermediate and dopant concentrations of the active layer and the first drain region;
   a second drain region disposed in the substrate adjacent to and in contact with the doped region adjacent to the second gate electrode, on the opposite side of the second gate electrode from the source region, and having a dopant concentration substantially the same as the dopant concentration of the first drain region; and
   source and first and second drain electrodes disposed on the source region and the first and second drain regions respectively.

5. The dual field effect transistor structure of claim 4 wherein the first compound semiconductor is selected from the group consisting of GaAs and InP and the second compound semiconductor is selected from the group consisting of AlGaAs and InGaAs.

6. The dual field effect transistor structure of claim 4 wherein the substrate is GaAs, the dopant concentration of the active layer is approximately $2 \times 10^{17}$ cm$^{-3}$, the dopant concentration of the source region is approximately $1 \times 10^{19}$ cm$^{-3}$, and the dopant concentration of the first and second drain regions is approximately $2 \times 10^{18}$ cm$^{-3}$.

7. A dual field effect transistor structure comprising:
   a semi-insulating first compound semiconductor substrate having a surface;
   a first compound semiconductor active layer disposed on the surface of the substrate and having a first dopant concentration;
   source and first and second drain electrodes disposed on the source region and the first and second drain regions, respectively.

8. The dual field effect transistor structure of claim 7 wherein the first compound semiconductor is selected from the group consisting of GaAs and InP and the second compound semiconductor is selected from the group consisting of AlGaAs and InGaAs.

9. The dual field effect transistor structure of claim 7 wherein the substrate is GaAs, the dopant concentration of the active layer is approximately $2 \times 10^{17}$ cm$^{-3}$, the dopant concentration of the source region is approximately $1 \times 10^{19}$ cm$^{-3}$, and the dopant concentration of the first and second drain regions is approximately $2 \times 10^{18}$ cm$^{-3}$.

10. The dual field effect transistor structure of claim 1 including an etch-stopping layer of a second compound semiconductor different from the first compound semiconductor disposed between and contacting the active layer, the source region, and the first and second electrically insulating side wall films.

11. The dual field effect transistor structure of claim 4 including an etch-stopping layer of a second compound semiconductor different from the first compound semiconductor disposed between and contacting the active layer, the source region, and the first and second electrically insulating side wall films.

12. The dual field effect transistor structure of claim 7 including an etch-stopping layer of a second compound semiconductor different from the first compound semiconductor disposed between and contacting the active layer, the source region, and the first and second electrically insulating side wall films.

* * * * *

UNITED STATES PATENT AND TRADEMARK OFFICE
CERTIFICATE OF CORRECTION

PATENT NO. : 5,225,703
DATED : July 6, 1993
INVENTOR(S) : Mitsunori Nakatani

It is certified that error appears in the above-indentified patent and that said Letters Patent is hereby corrected as shown below:

```
Claim 1, col. 11, line 55, after "second" insert
--drain--.

Claim 4, col. 12, line 33, change "and" to --the--;

Claim 4, col. 12, line 44, after "regions" insert
--,--.
```

Signed and Sealed this

Twenty-sixth Day of April, 1994

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,225,703

DATED : July 6, 1993

INVENTOR(S) : Mitsunori Nakatani

It is certified that error appears in the above-identified patent and that said Letters Patent is hereby corrected as shown below:

Claim 1, col. 11, line 55, after "second" insert --drain--.

Claim 4, col. 12, line 33, change "and" to --the--;

Claim 4, col. 12, line 44, after "regions" insert --,--.

Claim 7, col. 12, line 63, insert missing paragraphs from the claim:

--   an epitaxial first compound semiconductor source region disposed on part of the active layer having a second dopant concentration higher than the first dopant concentration;

a source electrode disposed on the source region;

first and second gate electrodes disposed on the active layer on opposite sides of the source region;

first and second electrically insulating side wall films disposed on the active layer between and contacting the source region and the first and second gate electrodes, respectively;

first and second doped regions disposed in the substrate adjacent to and in contact with the active layer, respectively adjacent to the first and second gate electrodes with the first and second gate electrodes disposed between the source region and the first and second doped regions, first and second drain regions disposed in the substrate respectively adjacent to and in contact

UNITED STATES PATENT AND TRADEMARK OFFICE
CERTIFICATE OF CORRECTION

PATENT NO. : 5,225,703
DATED : July 6, 1993
INVENTOR(S) : Mitsunori Nakatani

It is certified that error appears in the above-indentified patent and that said Letters Patent is hereby corrected as shown below:

with the first and second doped regions adjacent
to the first and second gate electrodes with
the first and second doped regions disposed between
the first gate electrode and the first drain region
and between the second gate electrode and the second
drain region, respectively, and having substantially
the same dopant concentrations that are intermediate
the dopant concentrations of the source region and
the active layer, wherein the dopant concentrations
of the doped regions are intermediate the dopant
concentrations of the active layer and the first and
second drain regions; and--.

This certificate supersedes Certificate of Correction issued April 26, 1994.

Signed and Sealed this

First Day of November, 1994

Attest:

BRUCE LEHMAN

*Attesting Officer*          *Commissioner of Patents and Trademarks*